United States Patent [19]
Lee et al.

[11] Patent Number: 6,150,456
[45] Date of Patent: Nov. 21, 2000

[54] HIGH DIELECTRIC CONSTANT FLEXIBLE POLYIMIDE FILM AND PROCESS OF PREPARATION

[75] Inventors: Yueh-Ling Lee, Columbus; Gary Min, Grove City, both of Ohio

[73] Assignee: E. I. du Pont de Nemours and Company, Wilmington, Del.

[21] Appl. No.: 09/312,185

[22] Filed: May 14, 1999

Related U.S. Application Data

[63] Continuation of application No. 08/927,982, Sep. 11, 1997.

[51] Int. Cl.[7] .................................................... C08L 79/08
[52] U.S. Cl. ........................ 524/606; 428/325; 428/473.5; 524/408; 524/413; 524/433; 524/434; 524/435; 524/436; 524/607
[58] Field of Search ................................. 428/325, 473.5; 524/408, 413, 433, 434, 435, 436, 606, 607

[56] References Cited

U.S. PATENT DOCUMENTS

| | | | |
|---|---|---|---|
| 5,162,977 | 11/1992 | Paurus et al. | 361/401 |
| 5,252,700 | 10/1993 | Okikawa et al. | 528/353 |
| 5,298,331 | 3/1994 | Kanakarajan et al. | 428/458 |

FOREIGN PATENT DOCUMENTS

| | | |
|---|---|---|
| 0 327 355 | 8/1989 | European Pat. Off. . |
| 57-11407 | 1/1982 | Japan . |
| 58-69252 | 4/1983 | Japan . |
| 2-218768 | 8/1990 | Japan . |
| 5-57853 | 9/1993 | Japan . |
| 8-41247 | 2/1996 | Japan . |
| 10-77406 | 3/1998 | Japan . |
| 2 113 471 | 8/1983 | United Kingdom . |
| WO92/18213 | 10/1992 | WIPO . |

OTHER PUBLICATIONS

Patent Abstracts of Japan, vol. 095, No. 001, Feb. 28, 1995.
Patent Abstracts of Japan, vol. 096, No. 011, Nov. 29, 1996.
Patent Abstracts of Japan, vol. 095, No. 003, Apr. 28, 1995.
Patent Abstracts of Japan, vol. 014, No. 497, Oct. 30, 1990.
Database WPI, Section Ch, Week 8041, Derwent Publications, Ltd, London, GB, Class A85, AN 80–72495C Aug. 29, 1980.

Primary Examiner—D. S. Nakarani

[57] ABSTRACT

A flexible, high dielectric constant polyimide film composed of either a single layer of an adhesive thermoplastic polyimide film or a multilayer polyimide film having adhesive thermoplastic polyimide film layers bonded to one or both sides of the film and having dispersed in at least one of the polyimide layers from 4 to 85 weight % of a ferroelectric ceramic filler, such as barium titante or polyimide coated barium titanate, and having a dielectric constant of from 4 to 60. The high dielectric constant polyimide film can be used in electronic circuitry and electronic components such as multilayer printed circuits, flexible circuits, semiconductor packaging and buried film capacitors.

4 Claims, No Drawings

HIGH DIELECTRIC CONSTANT FLEXIBLE POLYIMIDE FILM AND PROCESS OF PREPARATION

This Application is a Continuation of Ser. No. 08/927,982 Sep. 11, 1997.

BACKGROUND OF THE INVENTION

The present invention relates to a flexible, high dielectric constant polyimide film, composite and high dielectric constant polyimide liquid for use in electronic circuitry and electronic components including multilayer printed circuits, flexible circuits, semiconductor packaging and buried film capacitors.

Conventional decoupling capacitors are mounted on the surface of printed circuits boards and are connected to the power and ground planes near the integrated circuit. For a typical printed circuit board having a large number of integrated circuits, a corresponding large number of decoupling capacitors is typically required to provide for current requirements and to reduce system noise. Such capacitors, however, have disadvantages since they occupy considerable printed circuit board surface space, increase the number of solder joints and, therefore, reduce the system reliability.

Recently, a new capacitor design, called a buried film capacitor, has been developed which generates sufficient bypass capacitance to be shared throughout the printed circuit board. For example, U.S. Pat. No. 5,162,977, issued to Paurus et al on Nov. 10, 1992, discloses a printed circuit board which includes an embedded high capacitance power distribution core consisting of a signal ground plane and a power plane separated by a dielectric core element having a high dielectric constant. This buried capacitive structure not only provides electromagnetic interference (EMI) suppression but also makes it possible to remove up to 98% of the discrete bypass capacitors from the printed circuit board. The dielectric core element disclosed in U.S. Pat. No. 5,162,977 consists of glass cloth impregnated with an epoxy resin loaded with a ferroelectric ceramic powder having a high dielectric constant. Such conventional glass fiber impregnated epoxy resin systems, however, provide a capacitance density of up to 2000 picofarads/inch$^2$, which is not sufficient for the inrush current requirements of most integrated circuits.

The present invention provides a flexible, high dielectric constant polyimide in the form of a film, composite or liquid, which when used as the dielectric core component of an embedded high capacitance power distribution core in a printed circuit board or in semiconductor packaging, provides a much higher capacitance surface density of 200,000 picofarads/inch$^2$ due to the higher dielectric constants obtainable and the thinner film structures employed. A printed circuit board with such capacitance characteristics typically requires no additional decoupling for the associated printed circuit board components, and thus obviates the need for decoupling capacitors which are mounted externally on the printed circuit board.

SUMMARY OF THE INVENTION

The present invention provides a high dielectric constant, flexible polyimide film comprising a single layer of an adhesive thermoplastic polyimide film having dispersed therein from 4 to 85 weight %, based on the weight of the film, of a ferroelectric ceramic filler wherein the polyimide film has a dielectric constant of from 4 to 60.

The present invention also provides a high dielectric constant polyimide liquid comprising from 1 to 30 weight % of a thermoplastic or thermoset polyamic acid dissolved in 10 to 95 weight % of an inert organic solvent having dispersed therein from 4 to 90 weight % of ferroelectric ceramic filler and having a dielectric constant of from 4 to 300.

The present invention further provides a high dielectric constant, flexible multilayer polyimide film comprising a center thermoplastic or thermoset polyimide film layer having thin layers of an adhesive thermoplastic polyimide film on one or both sides and having dispersed in at least one of the polyimide layers from 4 to 85 weight %, based on the weight of the film layer, of a ferroelectric ceramic filler wherein the multilayer polyimide film has a dielectric constant of from 4 to 60.

The present invention still further provides a printed circuit board which includes an embedded high capacitance power distribution core comprising:

(a) an electrically conductive ground plane layer;
(b) an electrically conductive power plane layer; and
(c) a flexible high dielectric core element disposed in parallel relationship between said ground plane layer and said power plane layer comprising a single layer of an adhesive thermoplastic polyimide film or a multilayer polyimide film comprising a center thermoplastic or thermoset polyimide film layer having thin layers of an adhesive thermoplastic polyimide film on one or both sides and having dispersed in at least one of the polyimide film layers from 4 to 85 weight %, based on the weight of the film layer, of a ferroelectric ceramic filler and wherein the film has a dielectric constant of from 4 to 60.

DETAILED DESCRIPTION OF THE INVENTION

The present invention relates to a flexible, high dielectric constant polyimide film composed of either a single layer of an adhesive thermoplastic polyimide film or a multilayer polyimide film having adhesive thermoplastic polyimide film layers bonded to one or both sides of the film and containing a high dielectric constant ferroelectric ceramic filler or a mixture of fillers.

The adhesive thermoplastic polyimide film layers provide adhesion to various metal substrates such as capacitor ground and power planes and provide a smoother surface for enhancing the effective capacitance area.

The adhesive thermoplastic polyimide films used in the present invention include epoxy, acrylic, polyurethane and polyimide films. Particularly preferred are heat-sealable, thermoplastic, random or block polyimides which contain from 60 to 98 mole %, preferably from 70 to 95 mole %, of repeating imide units derived from 4,4'-oxydiphthalic dianhydride and an aromatic ether diamine of the formula

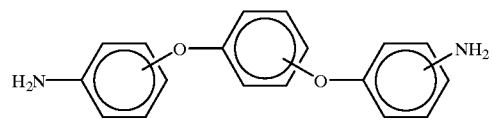

and from 2 to 40 mole %, preferably from 2 to 25 mole %, of additional repeating imide units derived from a tetravalent aromatic carboxylic dianhydride and a divalent aliphatic or aromatic diamine of the formula

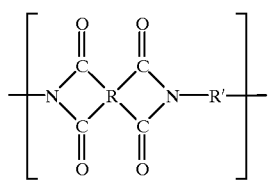

wherein R is an aromatic tetravalent organic radical and R' is a divalent radical of an aromatic or aliphatic diamine containing at least two carbon atoms, the two amino groups of the diamine each being attached to separate carbon atoms of the divalent radical.

Representative aromatic ether diamines include:
1,2-bis(4-aminophenoxy)benzene
1,3-bis(4-aminophenoxy)benzene
1,2-bis(3-aminophenoxy)benzene
1,3-bis(3-aminophenoxy)benzene
1-(4-aminophenoxy)-3-(3-aminophenoxy)benzene
1,4-bis(4-aminophenoxy)benzene
1,4-bis(3-aminophenoxy)benzene
1-(4-aminophenoxy)-4-(3-aminophenoxy)benzene Such additional imide units may be derived from dianhydrides and diamines which are the same or different from the 4,4'-oxydiphthalic dianhydride and aromatic ether diamines previously defined.

Particularly preferred dianhydrides and diamines include the following:
pyromellitic dianhydride;
4,4'-oxydiphthalic dianhydride;
3,3',4,4'-benzophenone tetracarboxylic dianhydride;
2,2',3,3'-benzophenone tetracarboxylic dianhydride;
3,3',4,4'-biphenyl tetracarboxylic dianhydride;
2,2',3,3'-biphenyl tetracarboxylic dianhydride;
2,2-bis(3,4-dicarboxyphenyl) hexafluoropropane dianhydride;
bis(3,4-dicarboxyphenyl)sulfone dianhydride;
bis(3,4-dicarboxyphenyl)sulfide dianhydride;
bis(2,3-dicarboxyphenyl)methane dianhydride;
bis(3,4-dicarboxyphenyl)methane dianhydride;
1,1-bis(2,3-dicarboxyphenyl) ethane dianhydride;
1,1-bis(2,3-dicarboxyphenyl) propane dianhydride;
2,2-bis(3,4-dicarboxyphenyl) propane dianhydride;
m-phenylene bis(trimellitate)dianhydride; hexamethylene diamine;
heptamethylenediamine;
3,3'-dimethylpentamethylenediamine;
3-methylhexamethylenediamine;
3-methylheptamethylenediamine;
2,5-dimethylhexamethylenediamine;
octamethylenediamine;
nonamethylenediamine;
1,1,6,6-tetramethylhexamethylenediamine;
2,2,5,5-tetramethylhexamethylenediamine;
4,4-dimethylheptamethylenediamine;
decamethylenediamine;
meta-phenylenediamine;
4,4'-diaminobenzophenone;
4-aminophenyl-3-aminobenzoate;
m-aminobenzoyl-p-aminoanilide;
4,4'-diaminodiphenylether;
3,4'-diaminodiphenylether;
bis(4-aminophenyl)methane;
1,1-bis(4-aminophenyl) ethane:
2,2-bis(4-aminophenyl) propane;
4,4'-diaminodiphenyl sulfoxide;
3,3'-diaminobenzophenone;
1,3-bis(4-aminophenoxy)benzene;
2,2'-diaminobenzophenone;
1,2-bis(4-aminophenoxy) benzene;
1,3-bis(4-aminobenzoyloxy) benzene;
4,4'-diaminobenzanilide;
4,4'-bis(4-aminophenoxy) phenyl ether;
2,2'-bis(4-aminophenyl) hexafluoropropane;
2,2-bis(4-aminophenyl)-1,3-dichloro-1,1,3,3-tetrafluoropropane;
4,4'-diaminodiphenyl sulfone;
1,12-diaminododecane; and
1,13-diaminotridecane.

Suitable adhesive thermoplastic polyimides for use in the present invention are disclosed in U.S. Pat. No. 5,298,331, issued to Kanakarajan et al on Mar. 29, 1994, which disclosure is incorporated herein by reference.

Particularly preferred adhesive polyimides for use in the invention contain from 70 to 95 mole % of 4,4'-oxydiphthalic dianhydride, 5 to 30 mole % of pyromellitic dianhydride and 100 mole % of 1,3-bis(4-aminophenoxy) benzene and from 80 to 95 mole % of 1,3-bis(4-aminophenoxy)benzene, 5 to 20 mole % of hexa-methylene diamine and 100 mole % of 4,4'-oxydiphthalic dianhydride.

Thermoplastic polyimides derived from 3,3'4,4'-biphenyltetracarboxylic dianhydride (BPDA), pyromellitic dianhydride (PMDA) and 4,4'-diaminodiphenyl ether can also be used as the polyimide film adhesive layer. Ranges of BPDA to PMDA of from 0.3 to 0.7 with a 55/45 BPDA/PMDA copolymer film being preferred.

Preferred examples of ferroelectric ceramic fillers that can be used in the present invention include particulate ferroelectric ceramic powders having a particle size ranging from 0.10 to 10 microns and having a high dielectric constant of from 100 to 30,000.

Specific examples of ceramic fillers include $BaTiO_3$, $SrTiO_3$, $Mg_2TiO_4$, $Bi_2(TiO_3)_3$, $PbTiO_3$, $NiTiO_3$, $CaTiO_3$, $ZnTiO_3$, $Zn_2TiO_4$, $BaSnO_3$, $Bi(SnO_3)_3$, $CaSnO_3$, $PbSnO_3$, $MgSnO_3$, $SrSnO_3$, $ZnSnO_3$, $BaZrO_3$, $CaZrO_3$, $PbZrO_3$, $MgZnO_3$, $SrZrO_3$ and $ZnZrO_3$. Dense polycrystalline ceramics such as barium titanate and lead zirconate are particularly preferred for use in the invention.

The improvement of the overall dielectric constant is obtained by incorporating the ceramic filler in an amount of from 4 to 85% by weight, preferably from 20 to 75% by weight, based on the total weight of the film composition. Ceramic filler concentrations below 4% by weight do not provide the requisite dielectric constant and ceramic filler loadings above 85% by weight tend to degrade film mechanical properties. Particularly good results are obtained with films containing from 20 to 65% by weight of ceramic filler, particularly barium titanate, which provides a dielectric constant of from 10 to 27.

The ceramic powder fillers can be used individually with good effect. When they are used in suitable combinations, however, the improvement of the dielectric constant can be effected to an even greater extent.

For example, barium titanate is a product of commerce and can be obtained in various grades which are characterized by dielectric constants ranging from about 100 to 30,000. The dielectric constant of barium titanate, as is well-known, reaches a maximum at the Curie point. Instead of using 100% of a single barium titanate, combinations of titanates of varying Curie point can be used to maintain constant dielectric performance as a function of temperature.

Mixtures of ceramic fillers, such as barium titanate, with conductive core/shell particulate fillers can also be used to increase the dielectric constant. Such conductive core/shell fillers include, among others, Zelec® ECP 3005-XC, commercially available from E. I. du Pont de Nemours and Company. Zelec® ECP 3005-XC is an antimony doped tin oxide coated silica particle filler containing 6.5% antimony and having a D50 particle size of 0.7 micron. Mixtures of from 5 to 80 weight % of barium titanate and from 5 to 15% by weight of Zelec® ECP 3005-XC provide a film with a dielectric constant of from 5 to 60 and have good elongation and adhesion properties.

In order to obtain good film integrity and even higher dielectric constant, the ceramic filler may also be surface coated with a polyimide before it is dispersed in the polyimide matrix. The polyimide matrix may be either a thermoplastic polyimide as previously described or a thermoset polyimide such as that prepared by reaction of pyromellitic dianhydride and 4,4'-diaminodiphenyl ether. The polyimide used to surface coat the ceramic filler can be either a thermoplastic or thermoset polyimide. The polyimide surface on the filler provides physical and chemical bonding sites, e.g. —$NH_2$, $O(CO)_2$, to bond the polyimide matrix to the filler resulting in much better film mechanical properties. In addition, the polyimide coated filler provides a uniform polymer coating on the surface of the ceramic filler which prevents filler aggregation and forms a polymer-filler network thereby increasing the dielectric constant and the maximum level of filler loading possible. In a typical example, a barium titanate filler coated with 7% by weight of a polyimide derived from pyromellitic dianhydride and 4,4'-diaminodiphenyl ether was used at a maximum loading of 75% by weight as compared to an uncoated barium titanate filler which was used at a maximum 60% by weight filler loading. The dielectric constant correspondingly increased from 13 for the uncoated barium titanate to 35 for the polyimide coated barium titanate.

The polyimide surface coating can contain from 1 to 99% by weight, preferably from 3 to 40 weight %, of coated ceramic filler, such as barium titanate, and provides a film with a dielectric constant of from 3 to 300. The thickness of the polyimide surface coating ranges from 10 nanometers to 20 micrometers, preferably from 300 nanometers to 3 micrometers.

Polyimide surface coatings include, among others, polyimides formed from pyromellitic dianhydride (PMDA) and 4,4'-diaminodiphenyl ether; 4,4'-oxydiphthalic dianhydride (ODPA), pyromellitic dianhydride (PMDA) and 1,3-bis(4-aminophenoxy)benzene; and 3,3',4,4'-biphenyltetracarboxylic dianhydride (BPDA), pyromellitic dianhydride (PMDA) and 4,4'-diaminodiphenyl ether.

The polyimide coated ceramic filler can be used alone or in combination with an uncoated ceramic filler. Mixtures of from 40% to 60% by weight of uncoated barium titanate and from 60% to 40% by weight of a 7 weight % polyimide coated barium titanate provide minimal filler aggregation and increase the dielectric constant of the polyimide film from 20 to 35.

A high dielectric constant polyimide film or composite can be prepared by melt extrusion and/or compression of the ceramic filler which has been surface coated with polyamic acid into sheets or three-dimensional composites without the necessity of using a polyimide matrix.

The polyamic acid coated on the ceramic filler surface can be either an adhesive thermoplastic or thermoset polyamic acid, such as ODPA/PMDA/ 1,3-bis(4-aminophenoxy)benzene; ODPA/hexamethylene diamine/1,3-bis-(4-aminophenoxy)benzene; BPDA/PMDA/4,4'-diaminodiphenyl ether; and PMDA/4,4'-diaminodiphenyl ether. The ceramic fillers can be any of those previously described, particularly barium titanate. As a typical example, a thermally compressed polyimide prepared from barium titante filler surface coated with from 8 to 40% by weight of polyamic acid was found to have a dielectric constant of from 15 to 170.

Incorporation of the high dielectric constant ceramic filler into the polyimide film can be made by pulverizing the ceramic filler into particles ranging in size from 0.10 to 10 microns, mixing the particles with the solution of polyamic acid precursor polymer and casting the resulting mixture into the shape of a film by conventional solvent die casting techniques.

The high dielectric constant polyimide film of the invention may be formed as a single layer or as a multilayer construction. No noticeable improvement in the dielectric constant can be obtained unless the produced film contains at least 4% by weight, preferably at least 20% by weight, of the ceramic filler based on the total weight of the single layer or multilayer polyimide film.

As a means for forming a multilayer construction, there may be used the extrusion-lamination method, thermal compression method, solution coating method and coextrusion method. These are typical, but not exclusive, examples of the methods available for forming of the multilayer film.

In order to increase the dielectric constant of the multilayer polyimide film, which consists of a center thermoplastic or thermoset polyimide layer and thin outer layers of thermoplastic, adhesive polyimide, the high dielectric constant ceramic filler must be incorporated into at least one of the layers of the multilayer structure. From 40 to 75 weight % of the ceramic filler can be incorporated into the center polyimide layer to provide a dielectric constant of from 6 to 24 for the multilayer structure. The ceramic filler can also be incorporated into the outer thin adhesive polyimide layers in order to further increase the dielectric constant. However, the concentration of ceramic filler incorporated into the thin adhesive polyimide layers and the center polyimide layer must be adjusted in order to both maximize physical properties and the adhesive peel strength of the final multilayer polyimide film. Typically from 20 to 50 weight % of ceramic filler can be incorporated into each of the outer adhesive polyimide layers.

The total thickness of the multilayer film structure ranges from 5 to 125 micrometers. The thickness of the center polyimide layer ranges from 5 to 120 micrometers and the thickness of the outer adhesive polyimide layers range from 5 to 60 micrometers.

The center polyimide layer of the multilayer structure can be a thermoplastic polyimide of the type previously described or a thermoset polyimide such as Kapton® H, derived from pyromellitic dianhydride and 4,4'-diaminodiphenyl ether, which is commercially available from E. I. du Pont de Nemours and Company.

Polyimide copolymer films such as those derived from 3,3',4,4'-biphenyltetracarboxylic dianhydride (BPDA), pyromellitic dianhydride (PMDA) and 4,4'-diaminodiphenyl ether containing a 55/45 molar ratio of BPDA/PMDA; and copolyimide films derived from 30 to 50 mole % of BPDA, 50 to 70 mole % of PMDA, 60 to 80 mole % of p-phenylene diamine and 20 to 40 mole % of 4,4'-diaminodiphenyl ether can also be used as the center polyimide layer.

An advantage of forming the film into a multilayer construction as contrasted to a single layer construction is that the ceramic filler particles tend to form irregularities on the surface of the single layer film so that when the film and coppper foils are superposed to form a capacitor, air is entrapped in the interfaces to the extent that it lowers the overall dielectric constant. This undesired phenomenon can be precluded by forming the film into a multilayer construction consisting of a center polyimide layer and thin outer layers of thermoplastic adhesive polyimide. In such a multilayer construction, the possibly adverse effect manifested on the opposite surfaces of the film due to an excessively high content of ceramic filler particles can be substantially eliminated by the superposed outer adhesive polyimide layers containing ceramic filler particles. The resulting smoother surfaces enhance the effective capacitance area.

The high dielectric constant, flexible polyimide film of the present invention may be used in a number of applications in the electronic circuitry design and manufacturing fields. For example, the polyimide film may be used in the manufacture of buried film capacitors in semiconductor packaging and printed wiring board packaging.

When used in semiconductor packaging applications, the requirement of total capacitance of the polyimide film substrate is much higher (>100 times) than that required for printed circuit board applications. Capacitance density is directly proportional to he dielectric constant and inversely proportional to the thickness of the substrate. An enhancement of capacitance can be achieved by either increasing the dielectric constant or reducing the thickness of the ceramic filled dielectric layer.

It has been found that a ceramic filled thermoplastic polyamic acid liquid can be thinly applied directly to the conductor planes by conventional means such as by spinning, spraying, curtain coating etc. The thin layer of high dielectric constant polyamic acid liquid can subsequently be dried and cured by thermal and/or chemical and/or photo treatment to form a thin polyimide film layer. Due to the ability to form thin polyimide layers ranging in thickness from 3 to 25 micrometers, the use of a polyamic acid liquid enhances capacitance by as much as 10 times compared to using a free-standing polyimide film at the same level of filler loading. In addition, a much higher weight % ceramic filler loading (up to 90 weight %) can be obtained using a polyamic acid liquid as compared to a free-standing polyimide film since there is less constraint on the need for physical integrity of the film. As a typical example, a high dielectric constant of 170 can be obtained using a polyamic acid liquid containing 90 weight % of ceramic filler.

The present invention will now be described more specifically with reference to the following working examples and comparative examples. However, the present invention is not in any way limited by the following examples.

The following standard ASTM test methods were used to measure the film properties described in the examples:

Dielectric constant (MHz)—ASTM NO.D-150
Elongation (%)—ASTM NO. D-882
Peel Strength (psi)—ASTM NO. D-5109
Tensile Strength (Kpsi)—ASTM NO. D-882
Modulus (Kpsi)—ASTM NO. D-882
Capacitance (pfarads/in$^2$)—ASTM NO. D-150
Dielectric Strength (V/mil)—ASTM NO. D-149

EXAMPLES 1 to 9 (Comparative Example 1C)

Examples 1 to 9 illustrate the increase in dielectric constant of a single layer adhesive thermoplastic polyimide film of the invention obtained as a function of increasing the amounts of barium titanate filler from 15 to 73% by weight, based on the total weight of the film. Optimum amounts of barium titanate filler ranging from 30 to 63% by weight provided a high dielectric constant of from 10 to 27 while still maintaining good film elongation and peel strength when compared to Example 1C without barium titanate filler (see Table I).

TABLE I

| Example No. | Single Layer Film* | BaTiO$_3$ (wt. %) | Dielectric Constant (1 MHz, RT) | Elongation (%) | Peel Strength (psi) |
|---|---|---|---|---|---|
| 1C | KJ | 0  | 3.8  | 48.9 | 13   |
| 1  | KJ | 15 | 4.7  | 32.2 | 12.8 |
| 2  | KJ | 30 | 9.8  | 19.2 | 12.6 |
| 3  | KJ | 40 | 11.7 | 12.6 | 12.3 |
| 4  | KJ | 50 | 15.2 | 8.4  | 10.6 |
| 5  | KJ | 56 | 17.3 | 4.7  | 9.8  |
| 6  | KJ | 63 | 26.6 | 3.0  | 8.7  |
| 7  | KJ | 73 | 32.0 | 2.5  | 7.2  |
| 8  | LJ | 50 | 9.6  | 5.7  | 6.8  |
| 9  | LJ | 60 | 12.3 | 4.5  | 6.5  |

*KJ: Kapton ® KJ is a thermoplastic copolyimide film derived from 70 to 95 mole % 4,4'-oxydiphthalic dianhydride, 5 to 30 mole % pyromellitic dianhydride and 100 mole % 1,3-bis(4-aminophenoxy)-benzene and is commercially available from E. I. du Pont de Nemours and Co.
*LJ: Kapton ® LJ is a thermoplastic copolyimide film derived from 80 to 95 mole % 1,3 bis(4-aminophenoxy)benzene, 5 to 20 mole % hexamethylene diamine and 100 mole % 4,4'-oxydiphthalic dianhydride.

EXAMPLE 10

Example 10 illustrates a high dielectric constant polyimide film composed of a single layer of a thermoplastic copolyimide film derived from 70 to 95 mole % of 4,4'-oxydiphthalic dianhydride, 5 to 30 mole % of pyromellitic dianhydride and 100 mole % of 1,3-bis(4-aminophenoxy) benzene containing 50 weight % of PbSnO$_3$ ceramic filler having a dielectric constant of 11.3 (1 MHz,RT) and an elongation of 12.1%.

EXAMPLE 11

Example 11 illustrates a high dielectric constant single layer polyimide film of the invention consisting of Kapton® KJ thermoplastic polyimide containing 72 weight % of a mixture of ceramic fillers composed of 50 weight % of uncoated barium titanate particles and 50 weight % of 7 weight % polyimide coated barium titanate particles.

The mechanical and electrical properties of the polyimide film are given in Table II.

TABLE II

| Mechanical Properties | Thickness (mil) | Elongation (%) | Tensile Strength (Kpsi) | Modulus (Kpsi) |
|---|---|---|---|---|
| Machine Direction    | 2.13 | 12.3 | 18.5 | 620 |
| Transverse Direction | 2.11 | 11.7 | 18.8 | 680 |

| Electrical Properties | Dielectric Constant | Dissipation Factor | Capacitance (pfarads/in$^2$) | Dielectric Strength (V/mil) |
|---|---|---|---|---|
| Measured at 1 KHz, RT | 33.4 | 0.004 | 3360 | 2500 |
| Measured at 1 MHz, RT | 33.1 | 0.018 | 2990 | 2500 |

EXAMPLE 12

Example 12 illustrates a high dielectric constant multilayer polyimide film of the invention having a thickness of 2 mils prepared by coextruding a center 1.5 mils thick Kapton® HA polyimide layer containing 50 weight % of barium titanate and outer 0.25 mil thick layers of Kapton® KJ polyimide adhesive each containing 45 weight % of barium titanate.

The mechanical and electrical properties of the coextruded, multilayer polyimide film are given in Table III.

TABLE III

| Mechanical Properties | Thickness (mil) | Elongation (%) | Tensile Strength (Kpsi) | Modulus (Kpsi) |
|---|---|---|---|---|
| Machine Direction | 1.96 | 8.7 | 16.6 | 658 |
| Transverse Direction | 1.99 | 5.8 | 17.1 | 703 |

| Electrical Properties | Dielectric Constant | Dissipation Factor | Capacitance (pfarads/in$^2$) | Dielectric Strength (V/mil) |
|---|---|---|---|---|
| Measured at 1 KHz, RT | 8.4 | 0.004 | 850 | 2600 |
| Measured at 1 MHz, RT | 8.0 | 0.015 | 700 | 2600 |

EXAMPLES 13 to 21

Examples 13 to 21 illustrate high dielectric constant multilayer polyimide films of the invention containing a single filler or a mixture of fillers. Examples 13 to 15, 19 and 20 are 2 mil thick high dielectric constant multilayer polyimide films having a center thermoset polyimide layer having a thickness of 1.7 mil and outer thermoplastic adhesive polyimide layers each having a thickness of 0.15 mil and containing varying amounts of barium titanate in the center layer or in both the center and outer layers.

Examples 16 to 18 are similar 2 mil thick multilayer polyimide films which contain a mixture of 50 weight % of barium titanate and 15 weight % of Zelec® ECP 3005XC silica coated particles in the center thermoset polyimide layer and from 0 to 50 weight % of barium titanate in the outer adhesive thermoplastic polyimide layers.

Example 21 is a 1.3 mil thick multilayer polyimide film consisting of a 0.80 mil layer of thermoset polyimide and a 0.50 mil layer of thermoplastic adhesive polyimide bonded to one side and containing barium titanate in both layers.

Table IV summarizes the dielectric constants and elongations of the multilayer films.

TABLE IV

| Example No. | Multilayer Film* Thickness (mil) | BaTiO$_3$ (Wt. %) | Dielectric Constant (1 MHz, RT) | Elongation (%) |
|---|---|---|---|---|
| 13 | 0.15KJ/1.7HA/0.15KJ | 0/50/0 | 7.6 | 11.2 |
| 14 | 0.15KJ/1.7HA/0.15KJ | 30/50/30 | 8.9 | 6.6 |
| 15 | 0.15KJ/1.7HA/0.15KJ | 30/63/30 | 14.3 | 4.7 |
| 16 | 0.15KJ/1.7HA/0.15KJ | 0/50 + 15Z**/0 | 8.5 | 11.7 |
| 17 | 0.15KJ/1.7HA/0.15KJ | 30/50 + 15Z**/30 | 12.4 | 9.8 |
| 18 | 0.15KJ/1.7HA/0.15KJ | 50/50 + 15Z**/50 | 13.8 | 7.6 |
| 19 | 0.15KJ/1.7HA/0.15KJ | 40/50/40 | 11.1 | 5.8 |
| 20 | 0.15KJ/1.7HA/0.15KJ | 50/50/50 | 12.7 | 5.3 |
| 21 | 0.80HA/0.50KJ | 50/30 | 9.3 | 9.5 |

*HA: Kapton ® HA is a polyimide film derived from pyromellitic dianhydride and 4,4'-diaminodiphenyl ether and is commercially available from E. I. du Pont de Nemours and Co.
**Z: Zelec ® ECP 3005XC is an antimony doped tin oxide coated silica shell filler having a molecular sieve structure and is commercially available from E. I. du Pont de Nemours and Co.

EXAMPLES 22 to 27

Examples 22 to 27 illustrate the preparation of liquid thermoplastic polyamic acids containing 15 weight % of a polyamic acid derived from 4,4'-oxydiphthalic dianhydride, pyromellitic dianhydride and 1,3-bis(4-aminophenoxy) benzene dissolved in dimethylacetamide solvent, coating of ceramic barium titanate filler particles with the liquid polyamic acids and thermal compression molding of the coated barium titanate particles to form high dielectric constant polyimide composites laminated to copper foil.

The polyamic acids were prepared by dissolving 1,3-bis (4-aminophenoxy)benzene (20.0 g) in 25 ml of pyridine with stirring over a 20 minute period. A solids mixture of 18 g of pyromellitic dianhydride and 4 g of 4,4'-oxydiphthalic dianhydride was added to the solution in 1 g portions over a total period of 2 hours. The final 0.80 g portion of the solids mixture was added slowly at a rate of 0.2 g every 15 to 20 minutes. The final viscosity of the 15% by weight polyamic acid solutions ranged from 100 to 2000 poises.

Varying amounts of barium titanate particles were separately blended with 156 ml portions of a mixture of pyridine and dimethylacetamide for 3 minutes. Thirty ml of the pyridine-dimethylacetamide slurry was then added to 100 g of the 15 weight % polyamic acid liquid with stirring over a 1 hour period. A mixture of acetone and methanol (100 g) was added and the mixture was stirred for 10 minutes. The mixture was filtered, the solid product was washed with acetone-methanol and dried (but not completely imidized) at 60° C. under a vacuum. The resultant surface coated polyamic acid barium titanate fillers were ground to a particle size of less than 10 microns.

Layers of copper foil were placed adjacent to a Kapton® H polyimide film spacer having a thickness of from 7 to 125 micrometers. The polyamic acid surface coated barium titanate filler particles were placed in the center of the film spacer.

The composites were placed between metal plates and laminated from 280° to 420° C., for from 5 minutes to 4 hours preferably at 350° C. for 30 minutes, to completely cure the polyamic acids and form the polyimides. The dielectric constants and peel strengths of the composites are given in Table V.

TABLE V

| Example No. | BaTiO$_3$ (wt. %) | Dielectric Constant (1 MHz, RT) | Peel Strength (psi) |
|---|---|---|---|
| 22 | 60 | 15 | 12 |
| 23 | 70 | 25 | 9 |
| 24 | 80 | 44 | 6 |
| 25 | 85 | 51 | 5 |
| 26 | 87 | 78 | 3 |
| 27 | 92 | 164 | 2 |

EXAMPLES 28 to 34

Examples 28 to 34 illustrate the preparation of high dielectric constant single layer thermoplastic or thermoset polyimide films of the invention prepared by coating thin layers of polyamic acid liquids prepared as described in Examples 22 to 27 and containing up to 91 weight % of barium titanate particles and curing to form the final polyimide films. Results are given in Table VI.

TABLE VI

| Example No. | Single Layer Film* | BaTiO₃ (Weight %) | Thickness (Micrometers) | Dielectric Constant (MHz, RT) |
|---|---|---|---|---|
| 28 | HA | 80 | 3.7 | 63 |
| 29 | HA | 91 | 3.1 | 137 |
| 30 | KJ | 78 | 9.1 | 65 |
| 31 | KJ | 85 | 7.3 | 89 |
| 32 | LJ | 75 | 6.8 | 53 |
| 33 | LJ | 80 | 8.0 | 60 |
| 34 | JP | 87 | 3.2 | 96 |

*JP: Kapton ® JP is a polyimide copolymer film derived from 55 mole % 3,3'4,4'-biphenyltetracarboxylic dianhydride, 45 mole % of pyromellitic dianhydride and 100 mole % 4,4'-diaminodiphenyl ether.

Very thin polyimide films were obtained containing high levels of barium titanate and which had high dielectric constants ranging from 53 to 137.

What is claimed is:

1. A high dielectric constant, flexible polyimide film comprising a single layer of an adhesive thermoplastic polyimide film having dispersed therein from 4 to about 85 weight percent, based on the weight of the film, of a ferroelectric ceramic filler which additionally includes an electrically conductive core/shell particulate filler and wherein the polyimide film has a dielectric constant of from 4 to 60.

2. A high dielectric constant, flexible polyimide film comprising a single layer of an adhesive thermoplastic polyimide film having dispersed therein from 4 to about 850 weight percent, based on the weight of the film, of a ferroelectric ceramic filler, said filler being surface coated with a thermoset polyimide derived from pyromellitic dianhydride and 4,4'-diaminodiphenyl ether, and wherein the polyimide film has a dielectric constant of from 4 to 60.

3. A high dielectric constant, flexible polyimide film comprising a single layer of an adhesive thermoplastic polyimide film having dispersed therein from 4 to about 85 weight percent, based on the weight of the film, of a ferroelectric ceramic filler, said filler being surface coated with a thermoset polyimide derived from 4,4'-oxydiphthalic dianhydride, pyromellitic dianhydride and 1,3-bis(4-aminophenoxy)benzene and wherein the polyimide film has a dielectric constant of from 4 to 60.

4. A high dielectric constant, flexible polyimide film comprising a single layer of an adhesive thermoplastic polyimide film having dispersed therein from 4 to about 85 weight percent, based on the weight of the film, of a ferroelectric ceramic filler comprising barium titanate, said filler being surface coated with a thermoset polyimide derived from 3,3',4,4'-biphenyltetracarboxylic dianhydride, pyromellitic dianhydride and 4,4'-diaminodiphenylether and wherein the polyimide film has a dielectric constant of from 4 to 60.

* * * * *

UNITED STATES PATENT AND TRADEMARK OFFICE
CERTIFICATE OF CORRECTION

PATENT NO : 6,150,456
DATED : November 21, 2000
INVENTOR(S) : Yueh-Ling Lee and Gary Min It is certified that error appears in the above-identified patent and that said Letters Patent is hereby corrected as shown below:

Column 12, line 1, delete "850" and substitute --85-- therefor.

Signed and Sealed this

First Day of May, 2001

Attest:

NICHOLAS P. GODICI

*Attesting Officer*    *Acting Director of the United States Patent and Trademark Office*